United States Patent [19]

Tsuchiya

[11] Patent Number: 4,853,831
[45] Date of Patent: Aug. 1, 1989

[54] BUS CONNECTION STRUCTURE FOR INTERRUPTION CONTROL SYSTEM

[75] Inventor: Masaki Tsuchiya, Tokyo, Japan
[73] Assignee: NEC Corporation, Tokyo, Japan
[21] Appl. No.: 154,583
[22] Filed: Feb. 10, 1988

[30] Foreign Application Priority Data

Feb. 12, 1987 [JP] Japan .................................. 62-30917
Feb. 12, 1987 [JP] Japan .................................. 62-30918

[51] Int. Cl.$^4$ ............................................. H05K 5/00
[52] U.S. Cl. .................................... 361/39.4; 361/390; 361/595; 361/401; 361/404; 361/415
[58] Field of Search ................... 361/1, 380, 390, 394, 361/395, 400, 401, 404, 413, 426

[56] References Cited

U.S. PATENT DOCUMENTS 4,647,123 3/1987 Chin et al. ...................... 361/413 X
4,704,599 11/1987 Kimmel et al. .................. 361/413 X
4,742,477 5/1988 Phillips et al. ................... 361/400 X

*Primary Examiner*—Derek S. Jennings
*Attorney, Agent, or Firm*—Burns, Doane, Swecker & Mathis

[57] ABSTRACT

The bus connection structure for an interruption control system consisting of, in a single cabinet, processors and at least one input/output control adapter connected to each processor includes elongated connectors having an identical structure and being arranged parallel to each other on a backboard provided inside the cabinet. Each connector has two terminal arrays consisting of identical numbers of terminals along the longitudinal direction. The connectors have one-to-one correspondence with the processors and the adapters. The connectors corresponding to the adapters which belong to a given processor are sequentially arranged on one side of the connector corresponding to the given processor. The interconnector wirings are formed on the backboard to be parallel to each other so as to connect opposing terminals of the adjacent connectors in one-to-one correspondence. The internal wirings are formed between the two terminal arrays of the connectors excluding those corresponding to the processors so that a predetermined number of terminals in the connectors corresponding to the adapters and a predetermined number of terminals in the connector corresponding to the given processor are connected to each other through the internal wirings and the interconnector wirings.

6 Claims, 3 Drawing Sheets

BUS CONNECTION STRUCTURE FOR INTERRUPTION CONTROL SYSTEM

BACKGROUND OF THE INVENTION

The present invention relates to a bus connection structure for connecting a plurality of processers and I/O unit adapters belonging to these processors inside a single cabinet and, more particularly, to a bus connection structure allowing construction of a flexible interruption control system.

Conventionally, when a system consisting of a plurality of processing units connected to a common bus and a plurality of adapters connected to the processing units is built in a single cabinet, the processing units and the adapters are connected in accordance with a wiring pattern on a backboard manufactured according to a predetermined mounting format, or the backboard is subjected to wire connection depending on the system structure. When an interruption signal terminal arranged on the backboard is to be replaced upon updating of the system, a switch is used.

The conventional bus connection structure described above has a limited system application range and has no flexibility for system updating. In addition, the conventional structure includes a factor of the erroneous operation of the system due to a setting error of the switch. When the system is updated in the bus connection structure using the wiring pattern on the backboard according to the predetermined mounting format, the wiring pattern for bus connection is fixed. Therefore, no adapters can be added, or when an adapter unit is removed, an unnecessary connector remains. When a system is constructed by wiring the backboard, if the system is to be updated, wiring for a new system is time-consuming and costly. In addition, wiring errors may occur at different locations depending on individual systems.

When a switch is arranged, if an identical adapter is connected to one processor, switches of the adapters must be set differently when the interruption priority order is changed.

SUMMARY OF THE INVENTION

It is an object of the present invention to provide a bus connection system which is free from the conventional drawbacks, can easily constitute an interruption control system and has high flexibility in updating of the system structure without any waste.

According to the present invention, there is provided a bus connection structure for an interruption control system which consists of, in a single cabinet, a plurality of processors connected to a common bus and at least one input/output control adapter connected to an internal bus of each processor, comprising: a plurality of elongated connectors which have an identical structure and are arranged on a backboard provided inside the cabinet, each connector having first and second terminal arrays consisting of identical numbers of terminals along a longitudinal direction thereof, the connectors having one-to-one correspondence with the plurality of processors and the adapters, the connectors corresponding to the adapters which belong to a given processor being sequentially arranged on one side of the connector corresponding to the given processor; a plurality of interconnector wirings which are formed on the backboard to be parallel to each other so as to connect opposing terminals of the adjacent connectors in one-to-one correspondence; and internal wirings which are formed between the first and second terminal arrays of the connectors excluding those corresponding to the processors so that a predetermined number of terminals in the connectors corresponding to the adapters and a predetermined number of terminals in the connector corresponding to the given processor are connected to each other through the internal wirings and the interconnector wirings.

DETAILED DESCRIPTION OF THE PREFERRED EMBODIMENTS

The present invention will be described hereinafter in detail with reference to the drawings.

Figure 1:
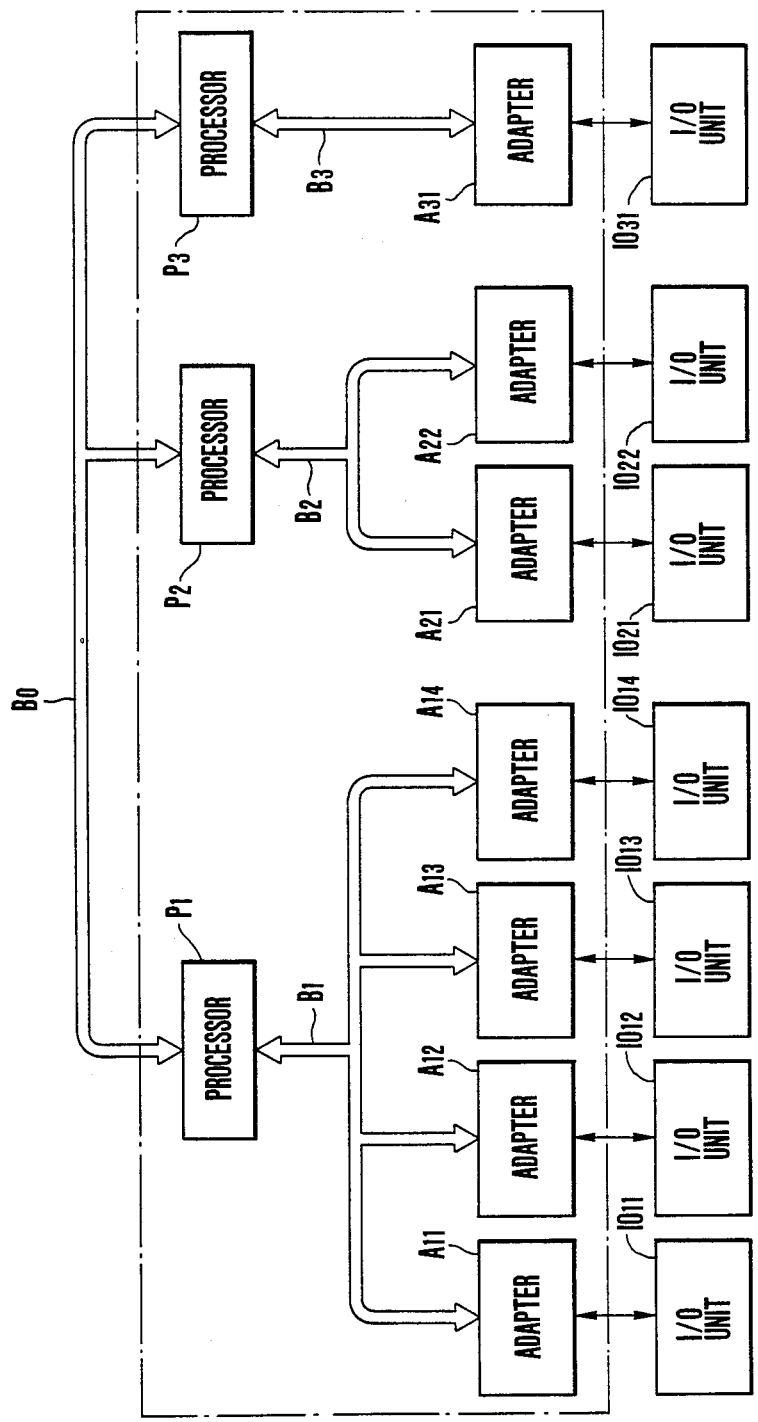
FIG. 1 is a block diagram showing the overall structure of an interruption control system to which the present invention is applied.

FIG. 1 shows a structure of an interruption control system to which the present invention is applied. In this embodiment, three processors are adopted, and a maximum of four I/O units can be connected to a single processor. The number of processors and the number of I/O units connected to a single processor are not limited to the above values.

Processors $P_1$, $P_2$, and $P_3$ are connected to a common bus $B_0$. Adapters $A_{11}$, $A_{12}$, $A_{13}$, and $A_{14}$ are connected to an internal bus $B_1$ of the processor $P_1$. The adapters $A_{11}$, $A_{12}$, $A_{13}$, and $A_{14}$ are connected to I/O units $IO_{11}$, $IO_{12}$, $IO_{13}$, and $IO_{14}$, respectively. Adapters $A_{21}$ and $A_{22}$ are connected to an internal bus $B_2$ of the processor $P_2$. The adapters $A_{21}$ and $A_{22}$ are connected to I/O units $IO_{21}$ and $IO_{22}$, respectively. An I/O unit $IO_{31}$ is connected to the processor $P_3$ through an internal bus $B_3$ and an adapter $A_{31}$.

Figure 2:
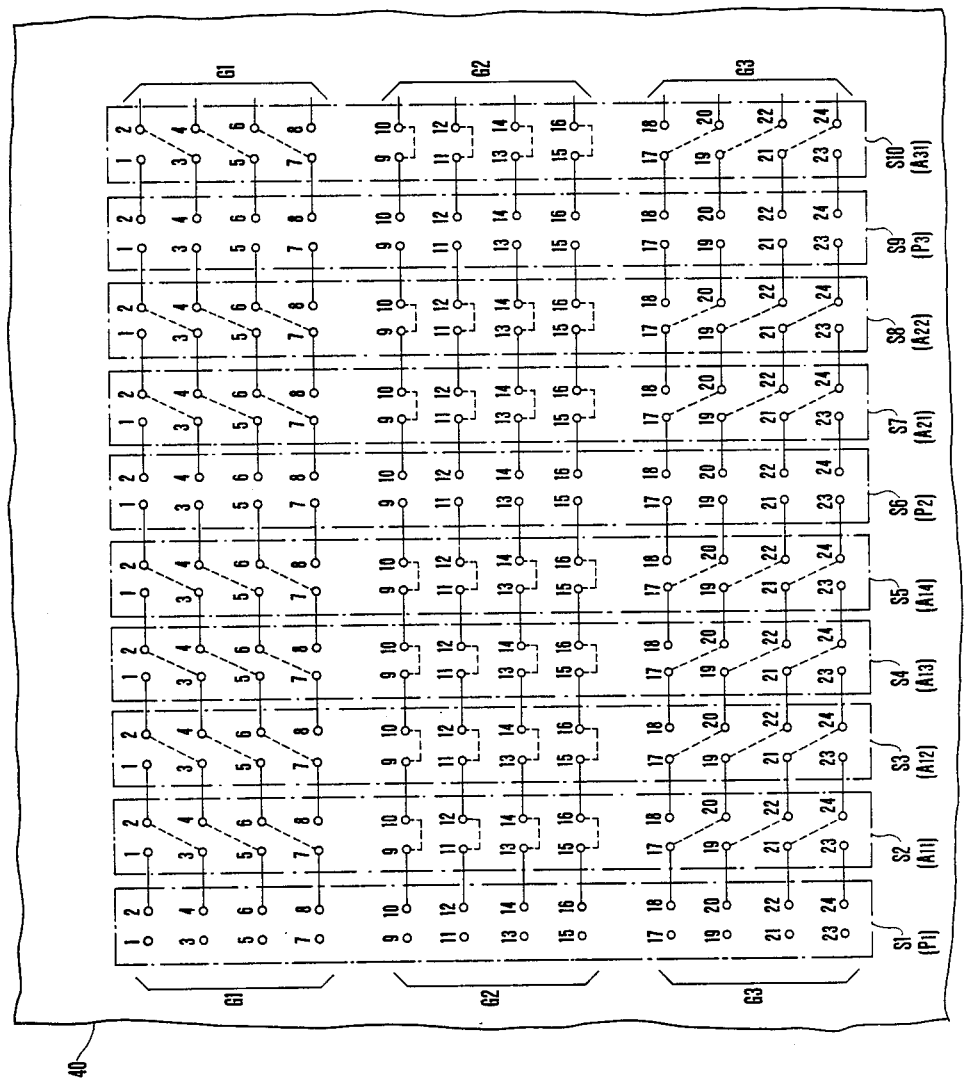
FIG. 2 is a plan view showing an embodiment of a bus connection structure for the system shown in FIG. 1.

FIG. 2 is a plan view showing an embodiment of bus connection when a portion surrounded by an alternately long and short dashed line in FIG. 1 is mounted in a single cabinet. In FIG. 2, 10 elongated connectors or slots $S_1$ to $S_{10}$ indicated by alternate long and short dashed lines are arranged on a backboard 40 arranged in the cabinet to be parallel to each other. The connectors $S_1$ to $S_{10}$ have one-to-one correspondence with processors and adapters given in parentheses. The connectors corresponding to the adapters belonging to the processors are sequentially arranged at an identical side, i.e., on the right side of FIG. 2, of the connectors $S_1$, $S_6$, and $S_9$ corresponding to the processors. More specifically, the connector $S_1$ corresponds to the processor $P_1$, the connectors $S_2$ to $S_5$ correspond to the adapters $A_{11}$ to $A_{14}$, respectively, the connector $S_6$ corresponds to the processor $P_2$, the connectors $S_7$ and $S_8$ correspond to the adapters $A_{21}$ and $A_{22}$, the connector $S_9$ corresponds to the processor $P_3$, and the connector $S_{10}$ corresponds to the adapter $A_{31}$.

The connectors $S_1$ to $S_{10}$ have an identical structure. Each connector has two terminal arrays each including 12 terminals in the longitudinal direction, i.e., a total of 24 terminals 1 to 24. Terminals in one terminal array are odd-numbered, and terminals in the other terminal array are even-numbered. Opposing terminals in the adjacent connectors are connected by parallel wirings formed on the backboard 40, as indicated by solid lines. More specifically, in FIG. 2, in two adjacent connectors, terminals 2, 4, . . . , 22, and 24 in the left connector are connected to terminals 1, 3, . . . , 21, and 23 in the right connector, respectively.

The terminals in each connector respectively belong to terminal groups $G_1$, $G_2$, and $G_3$. The terminals 1 to 8 belong to the terminal group $G_1$, the terminals 9 to 16 belong to the terminal group $G_2$, and the terminals 17 to 24 belong to the terminal group $G_3$.

The terminal group $G_1$ is used for outputting, inputting, or passing an interruption signal from a given adapter to a processor to which the given adapter belongs. The terminal group $G_2$ is used for outputting, inputting, or passing an interruption response signal from a processor to an adapter. The terminal group $G_3$ is used for outputting, inputting, or passing an adapter designating signal with which each adapter determines whether or not the interruption response signal is a response to a self interruption request.

In the connectors excluding the connectors $S_1$, $S_6$, and $S_9$ corresponding to the processors $P_1$, $P_2$, and $P_3$, the terminal arrays are connected in one-to-one correspondence, as indicated by dotted lines in FIG. 2. More specifically, in the terminal group $G_1$, the terminals 2 and 3, 4 and 5, and 6 and 7 are connected to each other by oblique parallel lines, respectively. In the terminal group $G_2$, the terminals 9 and 10, 11 and 12, 13 and 14, and 15 and 16 are connected to each other by horizontal parallel lines, respectively. In the terminal group $G_3$, the terminals 17 and 20, 19 and 22, and 21 and 24 are connected to each other by parallel lines inclined in a direction opposite to those in the terminal group $G_1$.

The structure and the operation of the interruption control system using the bus connection structure shown in FIG. 2 will be described.

For the sake of simplicity, the processor $P_1$ and the corresponding adapters $A_{11}$ to $A_{14}$ will be described.

The terminals 1 in the connectors $S_2$ to $S_5$ corresponding to the adapters are used as interruption signal output terminals from the adapters $A_{11}$ to $A_{14}$ to the processor $P_1$.

More specifically, an interruption signal from the adapter $A_{11}$ is supplied to the terminal 2 in the connector $S_1$ corresponding to the processor $P_1$. An interruption signal from the adapter $A_{12}$ is supplied to the terminal 4 for the processor $P_1$ through the terminals 2 and 3 in the connector $S_2$. An interruption signal from the adapter $A_{13}$ is supplied to the terminal 6 for the processor $P_1$ through the terminals 2 and 3 in the connector $S_3$ and the terminals 4 and 5 in the connector $S_2$. An interruption signal from the adapter $A_{14}$ is supplied to the terminal 8 for the processor $P_1$ through the terminals 2 and 3 in the connector $S_4$, the terminals 4 and 5 in the connector $S_3$, and the terminals 6 and 7 in the connector $S_2$. The processor $P_1$ sets a priority order for the interruption signals input to the terminals 2, 4, 6, and 8 corresponding to the adapters $A_{11}$ to $A_{14}$.

The processor $P_1$ outputs interruption response signals corresponding to the interruption signals input to the terminals 2, 4, 6, and 8 from the terminals 10, 12, 14, and 16 in accordance with the priority order. For example, if an interruption priority order is $A_{11} > A_{12} > A_{13} > A_{14}$, i.e., if the adapter $A_{11}$ has the highest priority and the adapter $A_{14}$ has the lowest priority, the response signals are output in the order of the terminals 10, 12, 14, and 16 of the connector $S_1$.

Since the terminals included in the terminal group $G_2$ of each connector are internally connected as described above, the interruption response signals corresponding to the adapters $A_{11}$, $A_{12}$, $A_{13}$, and $A_{14}$ are respectively supplied from the terminals 10, 12, 14, and 16 in the connector $S_1$ to the terminals 9, 11, 13, and 15 of the corresponding connectors. For this purpose, adapter designating signals are output from the processor $P_1$ through the terminal groups $G_3$ of the corresponding connectors as follows, so that each of the adapters $A_{11}$, $A_{12}$, $A_{13}$, and $A_{14}$ can discriminate whether the interruption response signal is output in response to self interruption. The terminals 18, 20, 22, and 24 in the connector $S_1$ corresponding to the processor $P_1$ are grounded to output signals corresponding to logic "0". The terminals 17 and 20, 19 and 22, and 21 and 24 in the connectors $S_2$, $S_3$, $S_4$, and $S_5$ are respectively connected to each other. Therefore, the terminals 20, 22, and 24 in the connector $S_2$ respectively output signals "0", "0", and "0". The terminal 18 in the connector $S_2$ outputs logic "1" corresponding to a non-ground state. The outputs from the terminals 20, 22, and 24 in the connectors $S_3$, $S_4$, and $S_5$ are respectively "1","0","0"; "1","1","0"; and "1","1","1". The adapters $A_{11}$ to $A_{14}$ respectively use signals input to the terminals 9, 11, 13, and 15 as the interruption response signals, respectively, when the combinations of the output signals from the terminals 20, 22, and 24 in the connectors $S_2$ to $S_5$ are "0","0","0"; "1","0","0"; "1","1","0"; and "1","1","1", respectively. With the above structure, the interruption response signals output from the terminals 10, 12, 14, and 16 in the connector $S_1$ serve as responses corresponding to the adapters $A_{11}$, $A_{12}$, $A_{13}$, and $A_{14}$, respectively.

Interruption control for the adapters $A_{21}$ and $A_{22}$ belonging to the processor $P_2$ is performed in the same manner as described above.

Since the terminals in the connectors $S_1$, $S_6$, and $S_9$ corresponding to the processors $P_1$, $P_2$, add $P_3$ are not internally connected, the internal buses $B_1$, $B_2$, and $B_3$ are isolated from each other.

The correspondences between the connectors $S_1$ to $S_{10}$, the processors, and the adapters are not limited to those illustrated in FIG. 2. The structure of FIG. 2 can be desirably changed in accordance with a system design.

For example, the processor $P_2$ is mounted on the connector $S_5$ in place of the adapter $A_{14}$, and a new adapter is mounted on the connector $S_6$ to constitute another system.

Figure 3:
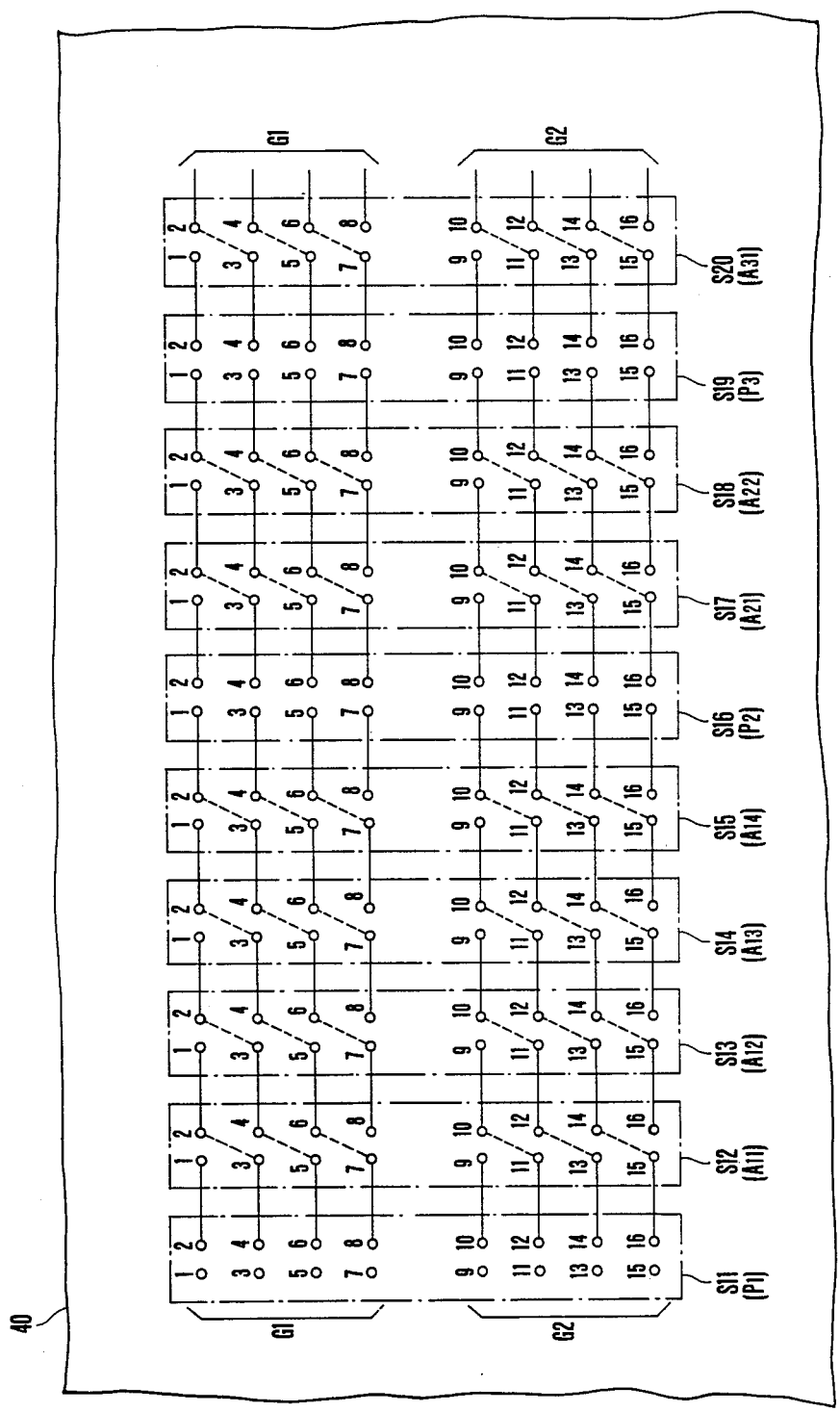
FIG. 3 is a plan view showing another embodiment of a bus connection structure.

FIG. 3 is a plan view of another embodiment of a bus connection structure for the interruption control system shown in FIG. 1.

Referring to FIG. 3, 10 elongated connectors $S_{11}$, $S_{12}$, . . . , $S_{20}$ are arranged on a backboard 40 to be parallel to each other. The connectors $S_{11}$ to $S_{20}$ have one-to-one correspondence with the processors and adapters given in parentheses in the same manner as in the above embodiment. The connectors $S_1$ to $S_{20}$ have an identical structure. Each connector has two terminal arrays each consisting of 8 terminals (a total of 16 terminals) in the longitudinal direction. Opposing terminals in two adjacent connectors are connected to each other by parallel wirings on the backboard, as indicated by solid lines.

Terminals 1 to 8 in each connector belong to a terminal group $G_1$, and terminals 9 to 16 therein belong to a terminal group $G_2$. The terminal group $G_1$ is used for outputting, inputting, or passing an interruption signal from each adapter to the corresponding processor. The terminal group $G_2$ is used for outputting, inputting, or passing an interruption response signal from the processor to the corresponding adapter.

In the connectors excluding connectors $S_{11}$, $S_{16}$, and $S_{19}$ corresponding to the processors $P_1$, $P_2$, and $P_3$, internal wiring is performed as indicated by dotted lines. More specifically, in each terminal group $G_1$, terminals 2 and 3, 4 and 5, and 6 and 7 are respectively connected to each other by oblique parallel lines. In each terminal group $G_2$, terminals 10 and 11, 12 and 13, and 14 and 15 are respectively connected to each other by parallel lines inclined in the same direction as those in the terminal $G_1$.

The structure and the operation of the interruption control system in FIG. 1 using the bus connection structure in FIG. 3 will be described below.

Interruption control of the processor $P_1$ and the corresponding adapters $A_{11}$ to $A_{14}$ will be exemplified.

The terminals 1 in the connectors $S_{12}$ to $S_{15}$ are used as interruption signal output terminals from the corresponding adapters $A_{11}$ to $A_{14}$, the terminals 9 are used as self interruption response signal input terminals from the processor $P_1$. More specifically, an interruption signal from the adapter $A_{11}$, which is output from the terminal 1 in the connector $S_{12}$, is input to the terminal 2 in the connector $S_{11}$. An interruption signal from the adapter $A_{12}$ is input to the terminal 4 in the connector $S_{11}$ through the terminals 2 and 3 in the connector $S_{12}$. An interruption signal from the adapter $A_{13}$ is input to the terminal 6 in the connector $S_{11}$ through the terminals 2 and 3 in the connector $S_{13}$ and the terminals 4 and 5 in the connector $S_{12}$. An interruption signal from the adapter $A_{14}$ is input to the terminal 8 in the connector $S_{11}$ through the terminals 2 and 3 in the connector $S_{14}$, the terminals 4 and 5 in the connector $S_{13}$, and the terminals 6 and 7 in the connector $S_{12}$.

The processor $P_1$ sets the priority order of interruption signals to the terminals 2, 4, 6, and 8, and outputs the interruption response signals respectively from the terminals 10, 12, 14, and 16 in the connector $S_{11}$ accordingly.

The terminals 10, 12, 14, and 16 in the connector $S_{11}$ are respectively connected to the terminals 9 in the connectors $S_{12}$, $S_{13}$, $S_{14}$, and $S_{15}$ by interconnector and intraconnector connections. Therefore, the adapters $A_{11}$, $A_{12}$, $A_{13}$, and $A_{14}$ can receive self interruption response signals at the corresponding terminals 9.

Interruption control for the processor $P_2$ and the adapters $A_{21}$ and $A_{22}$ is performed in the same manner as described above.

In the connectors $S_{11}$, $S_{16}$, and $S_{19}$ corresponding to the processors $P_1$, $P_2$, and $P_2$, no internal connection is performed. Therefore, the internal buses $B_1$, $B_2$, and $B_3$ are isolated.

In this embodiment, the system shown in FIG. 1 is used. However, the present invention is not limited to this, and other interruption control systems can be easily constituted using the same connection structure in accordance with a desired system design without errors.

According to the present invention as described above, a bus connection structure has a plurality of elongated connectors each having two terminal arrays, which are arranged on a backboard provided in a single cabinet to be parallel to each other, and all the opposing terminals in adjacent connectors are connected in one-to-one correspondence by wirings on the backboard. By using this bus connection structure, the connectors correspond to a plurality of processors and I/O unit adapters belonging to the corresponding processors, and internal connections are made between the above two terminal arrays in the connectors other than those corresponding to the processors, so that an interruption control system having a desired priority order can be easily constituted. The system configuration and the priority order can be changed without changing the basic bus connection structure described above, and complicated operations, e.g., setting of switches or changing of interruption signal terminals, are not required at all.

What is claimed is:

1. A bus connection structure for an interruption control system which comprises, in a single cabinet, a plurality of processors connected to a common bus, and at least one input/output control adapter connected to an internal bus of each of said processors, and in which each of said adapters outputs an interruption signal to the corresponding one of said processors, and each of said processors outputs an interruption response signal to the corresponding adapter, comprising:

a plurality of elongated connectors which are arranged on a backboard provided inside said cabinet and have an identical structure, each of said connectors having first and second terminal arrays consisting of the same numbers of terminals along a longitudinal direction thereof and being provided in one-to-one correspondence with said plurality of processors and said plurality of adapters, and connectors corresponding to adapters belonging to a given processor being arranged on one side of a connector corresponding to the given processor;

a plurality of interconnector wirings which are formed on said backboard to connect the opposing terminals of said connectors in one-to-one correspondence; and internal wirings which are formed between said first and second terminal arrays of said connectors excluding connectors corresponding to said processors, so that a predetermined number of terminals of each of the connectors corresponding to said adapters and a predetermined number of terminals of each of the connectors corresponding to said processors are connected through said interconnector wirings.

2. A bus connection structure according to claim 1, wherein two of said terminals of each of the connectors corresponding to said adapters are assigned to an interruption signal output terminal for outputting the interruption signal and an interruption response signal input terminal for receiving the interruption response signal, first and second terminal sets included in one of said terminal arrays of each of the connectors corresponding to the processors and each consisting of terminals corresponding in number to the adapters belonging to the processor are respectively assigned to terminals for inputting the interruption signals and terminals for outputting the interruption response signal, the terminals belonging to each of the first and second terminal sets have one-to-one correspondence in accordance with an interruption priority order determined by the processor, said internal wirings connect said interruption signal output terminals of the connectors corresponding to said adapters to the terminals in said first terminal sets of the connectors corresponding to said processors in oneto-one correspondence, and said interruption response signal input terminals of the connectors corresponding to said adapters are connected to the terminals in said second terminal sets in one-to-one correspondence.

3. A bus connection structure according to claim 2, wherein a terminal at an end of the terminal array of each of the connectors corresponding to the adapters closer to the connector corresponding to the processor to which the adapters belong is assigned to the interruption signal output terminal, and said internal wirings consist of a plurality of connection wirings for connecting terminals excluding the interruption signal output terminals.

4. A bus connection structure according to claim 3, wherein terminals at identical positions in the connectors corresponding to said adapters are assigned to the interruption response signal input terminals, and said internal wirings consist of a plurality of connection wirings for connecting terminals excluding the interruption response signal input terminals.

5. A bus connection structure according to claim 3, wherein terminals at different positions in the connectors corresponding to said adapters are assigned to the interruption response signal input terminals, said internal wirings are formed to connect the terminals at identical positions in the connectors, each of the connectors corresponding to said processors has a third terminal set, corresponding to the second terminal set, for outputting a signal for designating a destination adapter of the interruption response signal, and said internal wirings are formed so that the connectors corresponding to said adapters convert combinations of signal levels output from said third terminal sets into self codes.

6. An interruption control system comprising:
a backboard in which a plurality of identical slots each consisting of 1st to lth and 1'st to l'th interruption request terminals, 1st to mth and 1'st to m'th interruption response terminals, and 1st to nth and 1'st to n'th mounting position information terminals, and which includes wirings for connecting said 1'st to l'th interruption request terminals, said 1'st to m'th interruption response terminals, and said 1'st to n'th mounting position information terminals of each of said slots to said 1st to lth interruption request terminals, said 1st to mth interruption response terminals, and said 1st to nth mounting position information terminals of ones arranged adjacent to a predetermined side of said slots;

a processor unit mounted on any of said slots; and one or a plurality of adapter units which are mounted on the slots aligned on the predetermined side of the slot on which said processor unit is mounted, each of which is provided with a wiring for connecting an ith interruption request terminal to an $(i-1)$'th interruption request terminal, a wiring for connecting an ith interruption response terminal to an i'th interruption response terminal, and a wiring for connecting an ith mounting position information terminal to an $(i+1)$'th mounting position information terminal, and outputs an interruption request signal from the 1st interruption request terminal, wherein said processor unit outputs interruption response signals from said 1'st to m'th interruption response terminals in response to the interruption request signals input from said 1'st to l'th interruption request terminals, and outputs mounting position information signals from said 1'st to n'th mounting position information terminals, and each of said adapter units determines in accordance with the mounting position information signal input from said 1st to n'th mounting position information terminals whether the input interruption response signal is supplied to the self unit.

* * * * *